(12) United States Patent
Yang et al.

(10) Patent No.: US 8,710,865 B2
(45) Date of Patent: Apr. 29, 2014

(54) FIELD-PROGRAMMABLE ANALOG ARRAY WITH MEMRISTORS

(75) Inventors: Jianhua Yang, Foster City, CA (US); Muhammad Shakeel Qureshi, Santa Clara, CA (US); Gilberto Medeiros Ribeiro, Palo Alto, CA (US); R Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 100 days.

(21) Appl. No.: 13/281,438

(22) Filed: Oct. 26, 2011

(65) Prior Publication Data

US 2013/0106462 A1    May 2, 2013

(51) Int. Cl.
 *H03K 19/173*    (2006.01)
(52) U.S. Cl.
 USPC ............................... 326/39; 326/41; 326/49
(58) Field of Classification Search
 USPC ...................................................... 326/37–49
 See application file for complete search history.

(56) References Cited

U.S. PATENT DOCUMENTS

| | | | |
|---|---|---|---|
| 7,439,764 B2 | 10/2008 | Twigg | |
| 7,755,424 B2 * | 7/2010 | Mouttet | 330/86 |
| 7,969,186 B2 * | 6/2011 | Heaton | 326/38 |
| 2013/0010521 A1 * | 1/2013 | Carter | 365/148 |

FOREIGN PATENT DOCUMENTS

WO    WO-2010130296    11/2010

OTHER PUBLICATIONS

R.T. Edwards et al., "Analog Module Architecture . . . " article, 2nd Annual Military & Aerospace Applications of Prog'ble Devices & Techs. Conf., Sep. 27, 1999.
R.T. Edwards, "Analog Module Architecture . . . " presentation, 2nd Annual Military & Aerospace Applications of Prog'ble Devices & Techs. Conf., Sep. 27, 1999.
Hasler et al, "An OTA-based Large-scale Field Programmable Analog Array (FPAA) for faster On-CHip Communication and Computation", 2007.
Mouttet, Blaise, "Proposals for Memristor Crossbar Design and Applications", UC Berkeley, Nov. 21, 2008.
Sangho Shin et al, "Memristor Applications for Programmable Analog ICs'", IEEE Transactions on Nanotechnology, V.10(2), Mar. 2011.

* cited by examiner

*Primary Examiner* — James H Cho

(57) ABSTRACT

A field-programmable analog array (FPAA) includes a digital signal routing network, an analog signal routing network, switch elements to interconnect the digital signal routing network with the analog signal routing network, and a configurable analog block (CAB) connected to the analog signal routing network and having a programmable resistor array. The switch elements are implemented via digital memristors, the programmable resistor array is implemented via analog memristors, and/or antifuses within one or more of the digital signal routing network and the analog signal routing network are implemented via digital memristors.

16 Claims, 4 Drawing Sheets

FIELD-PROGRAMMABLE ANALOG ARRAY WITH MEMRISTORS

BACKGROUND

A field-programmable analog array (FPAA) is an integrated circuit device that includes configurable analog blocks (CABs) and interconnects between these blocks. An FPAA is similar to a field-programmable gate array (FPGA), but whereas the latter is solely digital, the former includes analog components. Unlike FPGAs, FPAAs tend to be more application driven than general purpose, as they may be current mode or voltage mode devices. For the latter, each CAB typically includes an operational amplifier in combination with a programmable configuration of passive components. The CABs can, for example, function as summers or integrators.

DETAILED DESCRIPTION

As noted in the background section, a field-programmable analog array (FPAA) is an integrated circuit device that includes configurable analog blocks (CABs) and interconnects between these blocks. A CAB, in addition to an operational amplifier, typically includes a programmable resistor array and/or a programmable capacitive array. An FPAA further generally includes a digital signal routing network, an analog signal routing network, and a number of switch elements to interconnect the former to the latter. The CABs are connected to the other side of the analog signal routing network from the switch elements.

At least two aspects of FPAAs have slowed their widespread adoption. First, transistors are generally used as the switch elements to interconnect the digital signal routing network to the analog signal routing network. Second, the programmable resistor array of each CAB usually includes resistive floating-gate transistors. However, transistors are low-density devices, and floating-gate transistors have relatively slow switching speeds, affecting the ultimate performance and capacity of the FPAAs that include them.

Disclosed herein are techniques to overcome these difficulties within FPAAs. First, the switch elements interconnecting the digital signal routing network to the analog signal routing network can be digital memristors. Second, analog memristors can implement the programmable resistor array. Third, antifuses within the digital signal routing network and/or the analog signal routing network that are selectively activate to program an FPAA can be implemented as digital memristors. Memristors, both digital and analog, are high-density devices that have relatively high switching speeds, resulting in FPAAs that include them having better performance and capacity than existing FPAAs.

A memristor is a passive two-terminal electrical component in which there is functional relationship between electric charge and magnetic flux linkage. When current flows in one direction through the device, electrical resistance increases, whereas when current flows in the opposite direction, resistance decreases. When current is stopped, the component retains the last resistance that it had, and when the flow of charge begins again, the resistance of the circuit will be what it was when it was last active. A memristor has an operational regime with an approximately linear charge-resistance relationship, so long as the time-integral of the current stays within certain bounds. A digital memristor has a number of discrete states, such as two, whereas an analog memristor has continuous states.

Figure 1:
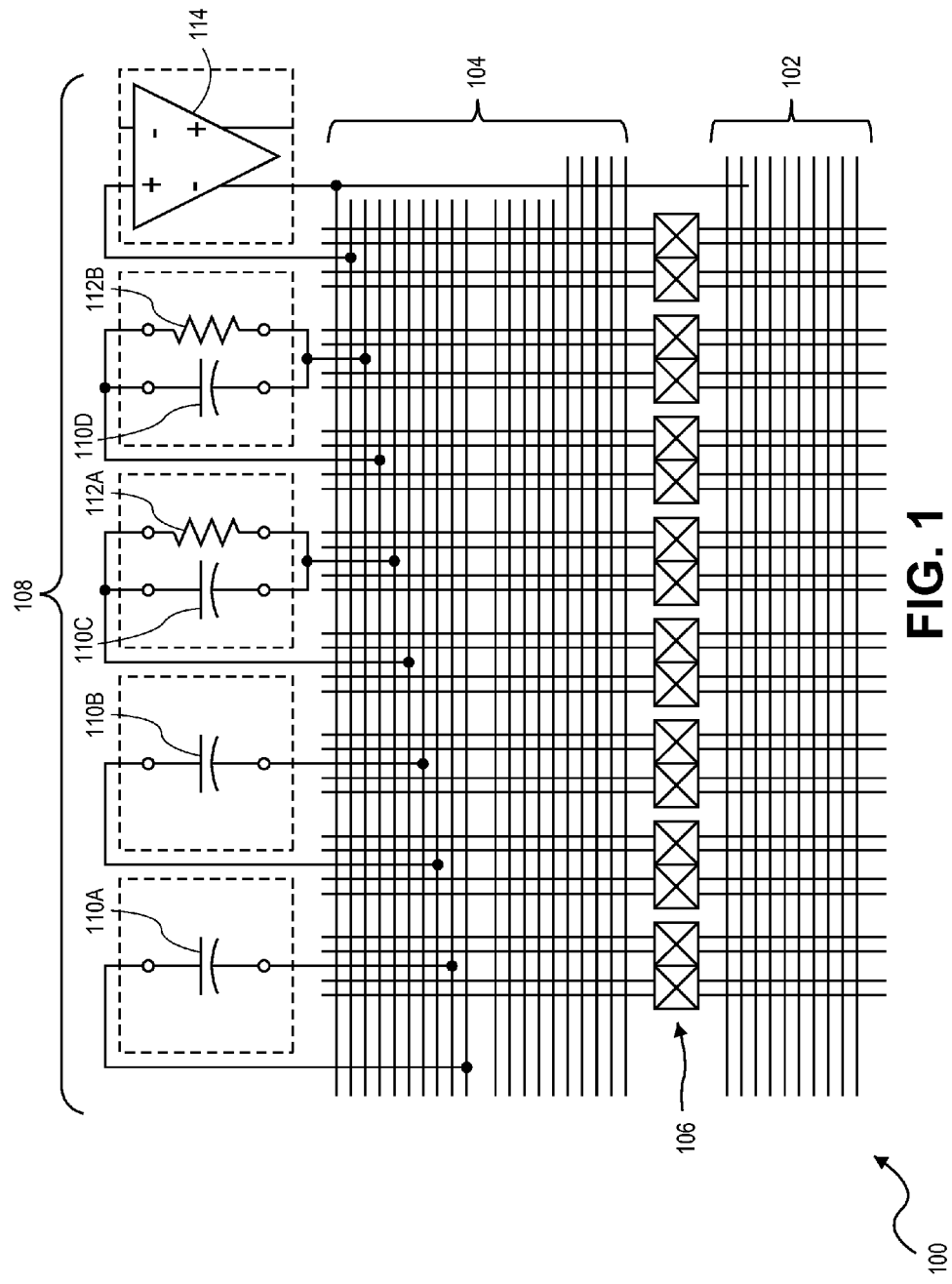
FIG. 1 is a diagram of a portion of an example field-programmable analog array (FPAA), including a portion of an example configurable analog block (CAB) thereof, and in which switch elements are implemented via digital memristors.

FIG. 1 shows a portion 100 of an example FPAA. The FPAA portion 100 includes a digital signal routing network 102, an analog signal routing network 104, and a number of switch elements 106. The FPAA portion 100 also includes a portion 108 of a CAB. The signal routing networks 102 include a number of lines that route electrical signals to and from the CAB portion 108. The digital signal routing network 102 routes incoming and outgoing digital signals to and from ultimately the CAB portion 108. The analog signal routing network 104 similarly routes incoming and outgoing analog to and from the CAB portion 108 directly.

The switch elements 106 interconnect the digital signal routing network 102 and the analog signal routing network 104. The switching elements 106 thus serve to isolate the digital signal routing network 102 from the analog signal routing network 104, and thus from the CAB portion 108, which is itself is analog as well. Each switching element 106 includes one or more digital memristors. As compared to transistors that normally implement the switching elements 106, digital memristors switch more quickly, and take up less space. Therefore, the FPAA including the portion 100 has higher performance, and can be smaller in size because the memristors have relatively small footprints and further can be stacked vertically.

The CAB portion 108 includes programmable capacitive arrays 110A, 110B, 110C, and 110D, which are collectively referred to as the programmable capacitive arrays 110, as well as programmable resistive arrays 112A and 112B, which are collectively referred to as the programmable resistive arrays 112. In the example of FIG. 1, therefore, there are two programmable capacitive arrays 110 and two programmable resistive arrays 112. However, more generally, there are one or more programmable capacitive arrays 110 and/or one or more programmable resistive arrays 112.

The programmable capacitive arrays 110 and the programmable resistive arrays 112 provide for the programmability of the FPAA that includes the portion 100. Specifically, this is achieved by setting antifuses within the digital signal routing network 102 and the analog signal routing network 104 to selectively connect the programmable capacitive arrays 110 and the programmable resistive arrays 112 to the signal routing networks 102 and 104. Such antifuses are not shown in FIG. 1, but are shown in and described in relation to a subsequent figure, later in the detailed description. Programming of the FPAA in this respect is comparable to programming a more typically solely digital FPGA.

The CAB portion 108 further includes an operational amplifier 114. Just the connections to one input and one output of the operational amplifier 114 are depicted in FIG. 1. This is because the CAB portion 100 is part of a differential CAB architecture, and represents one half of such a differential CAB architecture. The other half of the differential CAB architecture is not shown in FIG. 1, but is a mirror image of the CAB portion 100, and is connected to the other input and other output of the operational amplifier 114. This is shown and described in relation to a subsequent figure, later in the detailed description. The operational amplifier 114 serves to amplify the analog signals passing through the programmable capacitive array 110 and the programmable resistive array 112.

Figure 2:
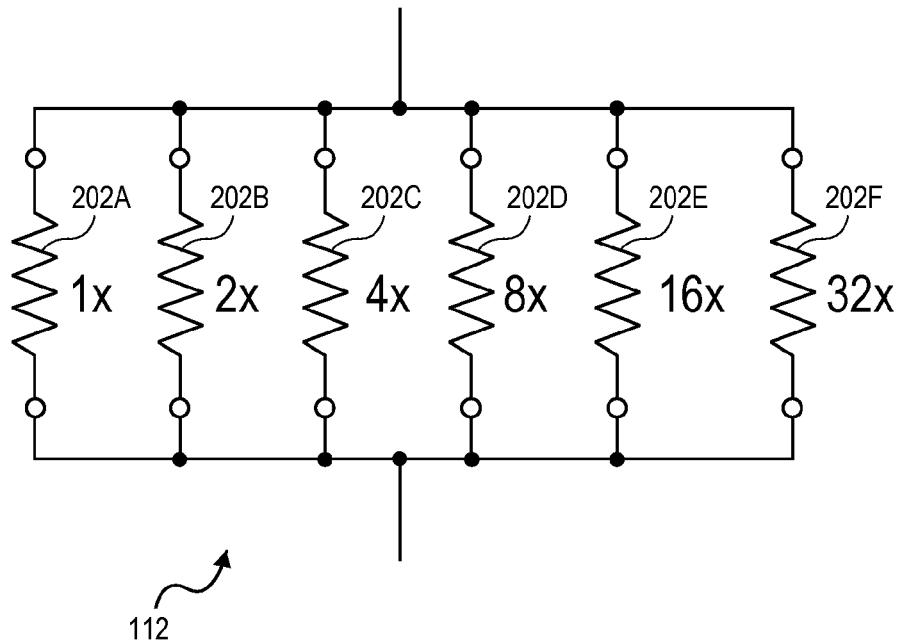
FIG. 2 is a diagram of an example programmable resistor array for a CAB of an FPAA, and which is implemented via analog resistors.

FIG. 2 shows an example programmable resistive array 112. The programmable resistive array 112 of FIG. 2 can implement each and any of the programmable resistive arrays 112 of FIG. 1. The programmable resistive array 112 includes reconfigurable resistive elements 202A, 202B, 202C, 202D, 202E, and 202F, collectively referred to as the reconfigurable resistive elements 202, and connected in parallel to one another. While there are six reconfigurable resistive elements 202 in the example of FIG. 2, in general there are at least two such reconfigurable resistive elements 202. Because there are six reconfigurable resistive elements 202 in FIG. 2, the programmable resistive array 112 of FIG. 2 is a six-bit array.

Each reconfigurable resistive element 202 can be implemented as or by one or more analog memristors. As compared to floating-gate transistors that normally implement the configurable resistive elements 202, analog memristors switch more quickly, more continuously, and take up less space. Therefore, the resulting FPAA has higher performance, and can be smaller in size.

The reconfigurable resistive elements 202 are labeled as 1x, 2x, 4x, 8x, 16x, and 32x in FIG. 2. This labeling corresponds to the bit numbers of the resistive elements 202. For instance, the resistive element 202 labeled 16x corresponds to the fourth bit, because two to the power of four is sixteen. It is noted that the resistive elements 202 are reconfigurable in that they can be selectively connected (i.e., activated) via antifuses, as has been described above.

Figure 3:
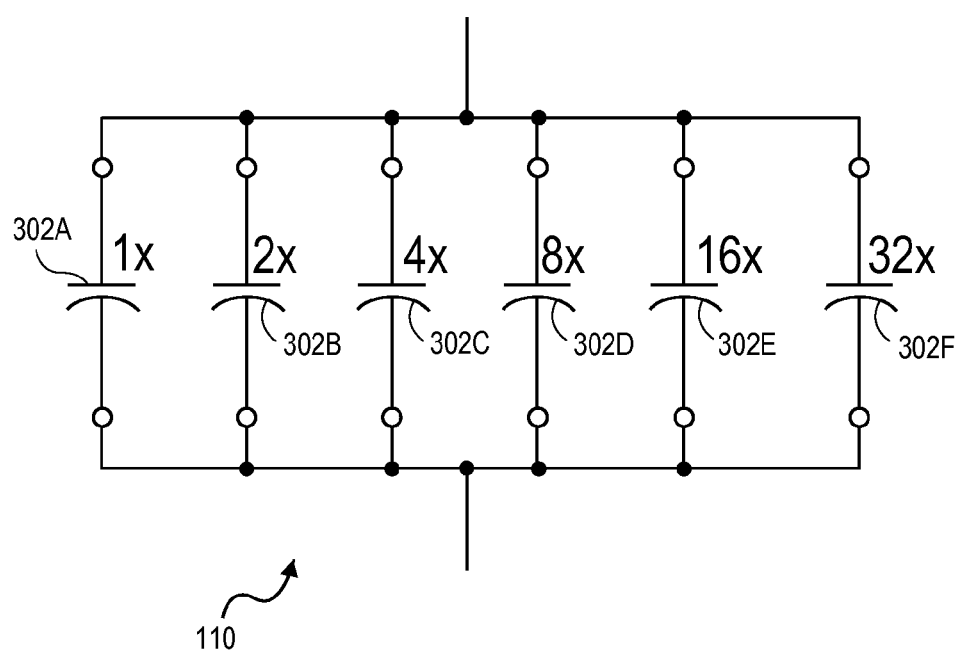
FIG. 3 is a diagram of an example programmable capacitive array for a CAB of an FPAA.

FIG. 3 shows an example programmable capacitive array 110. The programmable capacitive array 110 of FIG. 3 can implement each and any of the programmable capacitive arrays 110 of FIG. 1. The programmable capacitive array 110 includes reconfigurable capacitive elements 302A, 302B, 302C, 302D, 302E, and 302F, collectively referred to as the reconfigurable capacitive elements 302, and connected in parallel to one another. While there are six reconfigurable capacitive elements 302 in the example of FIG. 3, in general there are at least two such reconfigurable capacitive elements 302. Because there are six reconfigurable capacitive elements 302 in FIG. 3, the programmable capacitive array 110 of FIG. 3 is a six-bit array.

Each reconfigurable capacitive element 302 can be implemented as or by one or more capacitors. The reconfigurable capacitive elements 302 are labeled as 1x, 2x, 4x, 8x, 16x, and 32x in FIG. 3. Similar to as described in relation to the resistive elements 202 in FIG. 2, this labeling in FIG. 3 corresponds to the bit numbers of the capacitive elements 302 in FIG. 3. It is noted that the capacitive elements 302 are reconfigurable in that they can be selectively connected (i.e., activated) via antifuses, as has been described above.

Figure 4:
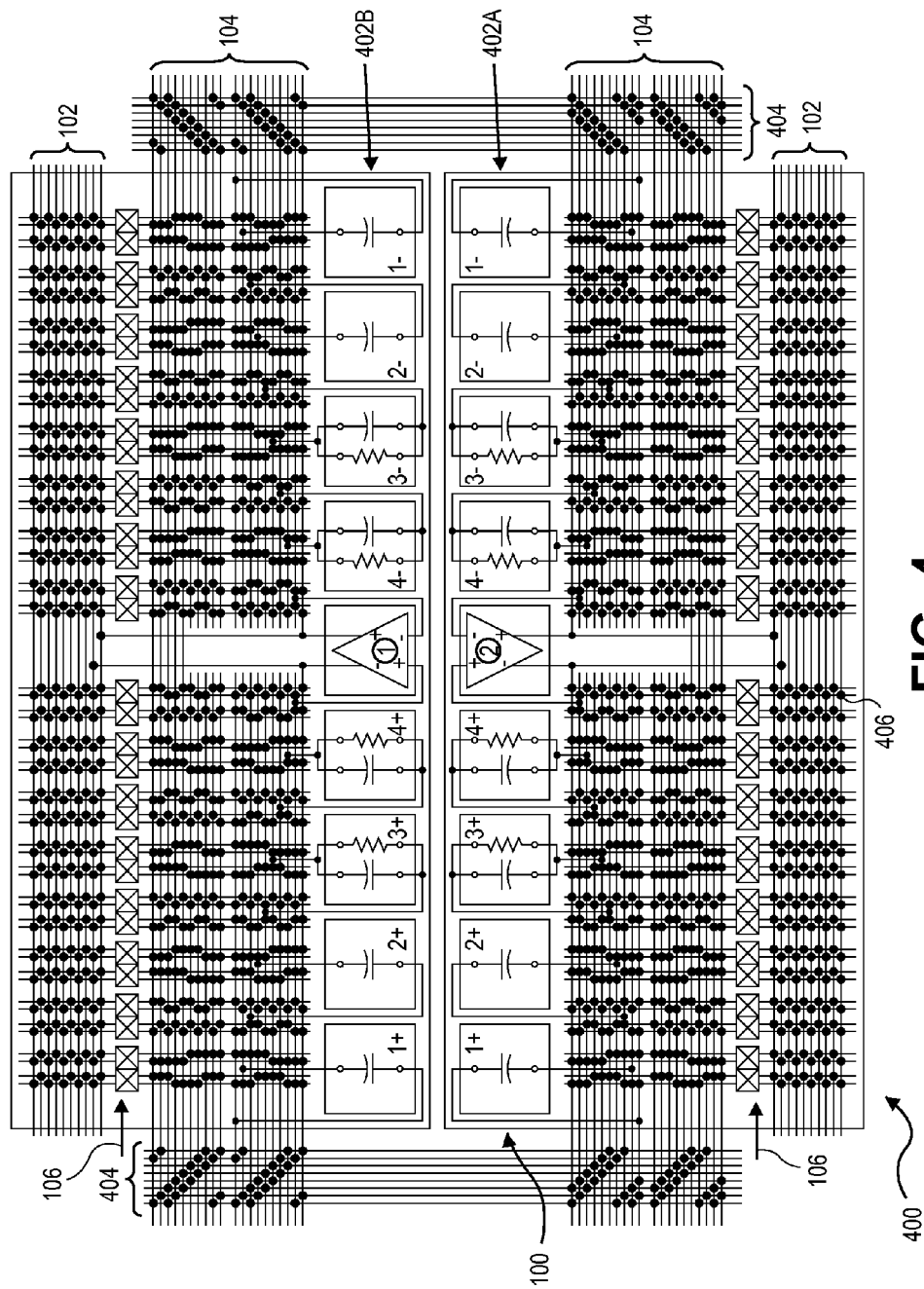
FIG. 4 is a diagram of an example FPAA.

FIG. 4 shows an example FPAA 400. The FPAA 400 includes the digital signal routing network 102, the analog signal routing network 104, and the switch elements 106 that have been described. The FPAA 400 further includes two CABs 402A and 402B, which are collectively referred to as the CABs 402. Each CAB 402 is made up of two complementary portions, such that each CAB 402 has a differential architecture. For instance, the left portion of the CAB 402 is the portion 100 that has been described.

The FPAA 400 also includes vertical signal lines 404. The vertical signal lines 404 interconnect the analog signal routing network 104 from top to bottom to one another. By comparison, the digital signal routing network 102 interconnects the FPAA 400 externally, to other components outside of the FPAA 400. There is a top digital signal routing network 102 for the CAB 402B, and a bottom digital signal routing network 102 for the CAB 402A. Likewise, there is a top analog signal routing network 104 for the CAB 402B, and a bottom analog signal routing network 104 for the CAB 402A.

As noted above, antifuses are employed to programmably configure the FPAA 400. Specifically, there is an antifuse at the intersections of lines extending from the CABs 402 and the liens of the analog signal routing network 104, and the intersections of the lines extending from the CABs 402 and the lines of the digital signal routing network 102. One antifuse 406 is explicitly called out in FIG. 4 as an example.

An antifuse is the opposite of a fuse. Whereas a fuse upon being activated severs an electrical connection, an antifuses being activated connects an electrical connection. By appropriately selecting the antifuses, therefore, the FPAA 400 can be programmed as desired. The antifuses may be reconfigurable, such that once they are activated they can be deactivated. In another implementation, the antifuses may not be reconfigurable, such that once they are activated that cannot be deactivated. In the former case, the FPAA 400 is reprogrammable, whereas in the latter case, the FPAA 400 is not reprogrammable.

In one implementation, the antifuses can each be implemented as a digital memristor, or as one or more digital memristors. Memristors are reconfigurable for a large number of times. For instance, some types of memristors can be reconfigured more than a trillion times. The digital memristors that implement the antifuses may be those that have large on/off conductance ratios.

Figure 5:
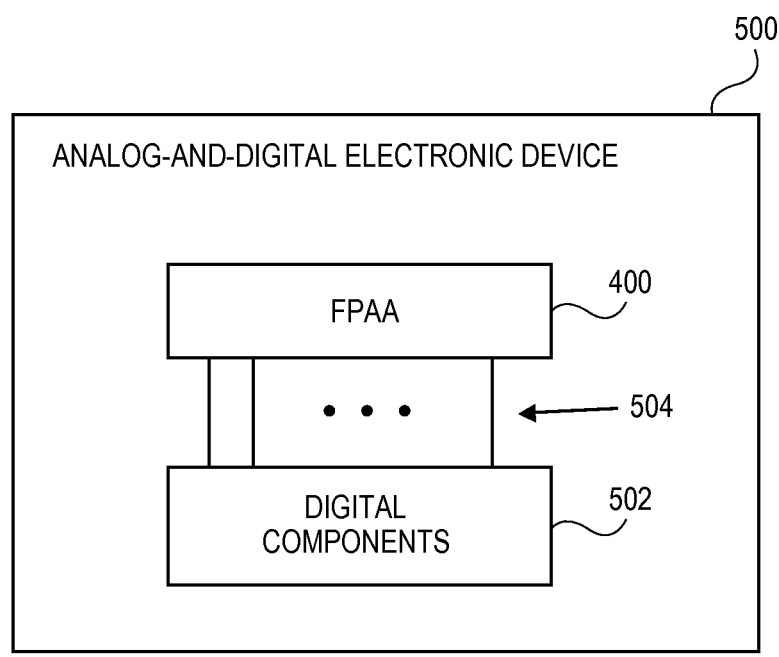
FIG. 5 is a diagram of an example analog-and-digital electronic device that includes an FPAA.

FIG. 5 shows an example analog-and-digital electronic device 500. The example electronic device 500 may be implemented as an integrated circuit (IC), or may be implemented on one or more printed circuit boards (PCBs) including one or more ICs. The electronic device 500 is an analog-and-digital electronic device because it employs both analog signals and digital signals.

The electronic device 500 includes the FPAA 400 that has been described, and in the example of FIG. 5, also includes one or more digital components 502, such as digital ICs. The digital components 502 are communicatively connected to the FPAA 400 via a number of digital lines 504. The digital lines 504 each carry one or more digital signals. The digital lines 504 interface with the digital signal routing network 102 of the FPAA 400. In the example of FIG. 5, then, the analog functionality of the electronic device 500 lies in the analog CABs 402 of the FPAA 400.

The electronic device 500 may perform a given functionality, at least in part based on the FPAA 400. It is noted that FPAAs are particularly suitable in extreme operating environments, such as on satellites deployed outside the earth's atmosphere. As such, the electronic device 500 may perform its functionality on such a satellite. By including the FPAA 400, the electronic device 500 operates at higher performance, and has a smaller size (or, stated another way, has a greater programmable capacity for a given size) than existing comparable electronic devices that include FPAAs that do not have memristors.

We claim:

1. A field-programmable analog array (FPAA) comprising:
a digital signal routing network;
an analog signal routing network;

a plurality of switch elements to interconnect the digital signal routing network with the analog signal routing network; and, a configurable analog block (CAB) connected to the analog signal routing network and having a programmable resistor array, wherein one or more of:
the switch elements are implemented via digital memristors;
the programmable resistor array is implemented via analog memristors;
antifuses within one or more of the digital signal routing network and the analog signal routing network are implemented via digital memristors.

2. The FPAA of claim 1, wherein the switch elements are implemented via the digital memristors, such that each switch element comprises one or more of the digital memristors.

3. The FPAA of claim 1, wherein the programmable resistor array is implemented via the analog memristors, such that the programmable resistor array comprises a plurality of reconfigurable resistive elements that are each implemented by one or more of the analog memristors.

4. The FPAA of claim 1, wherein the antifuses within the one or more of the digital signal routing network and the analog signal routing network are implemented via the digital memristors, such that each antifuses comprises one or more of the digital memristors.

5. The FPAA of claim 1, wherein the CAB further has a programmable capacitive array.

6. The FPAA of claim 1, wherein the CAB further has an operational amplifier.

7. The FPAA of claim 6, wherein the CAB has a differential architecture, such that the programmable resistor array is a first programmable resistor array connected to one side of the operational amplifier the CAB has a second programmable resistor array connected to another side of the operational amplifier.

8. The FPAA of claim 1, wherein the CAB is a first CAB, and the FPAA further comprises a second CAB.

9. A configurable analog block (CAB) for a field-programmable analog array (FPAA), comprising:
an operational amplifier;
a programmable resistor array connected to the operational amplifier and implemented by analog memristors; and
a programmable capacitive array connected to the operational amplifier.

10. The CAB of claim 9, wherein the programmable resistor array comprises a plurality of reconfigurable resistive elements that are each implemented by one or more of the analog memristors.

11. The CAB of claim 9, wherein the CAB has a differential architecture, such that the programmable resistor array is a first programmable resistor array connected to one side of the operational amplifier the CAB has a second programmable resistor array connected to another side of the operational amplifier.

12. An analog-and-digital electronic device comprising:
a field-programmable analog array (FPAA) having a digital signal routing network, an analog signal routing network, and a plurality of switch elements to interconnect the digital signal routing network to the analog signal routing network,
wherein one or more of:
the switch elements are implemented via digital memristors;
antifuses within one or more of the digital signal routing network and the analog signal routing network are implemented via digital memristors.

13. The analog-and-digital electronic device of claim 12, further comprising one or more electronic components connected to the FPAA, such that the electronic components together with the FPAA provide a functionality of the analog-and-digital electronic device.

14. The analog-and-digital electronic device of claim 12, wherein each antifuse within the one or more of the digital signal routing network and the analog signal routing network comprises one or more of the digital memristors.

15. The analog-and-digital electronic device of claim 12, wherein each switch element comprises one or more of the digital memristors.

16. The analog-and-digital electronic device of claim 12, wherein the FPAA further comprises a configurable analog block (CAB) connected to the analog signal routing network and having a programmable resistor array.

* * * * *